United States Patent [19]

Matrone et al.

[11] 4,230,985
[45] Oct. 28, 1980

[54] FIXTURING SYSTEM

[75] Inventors: John L. Matrone, Guilderland; Robert D. Roberts, Colonie, both of N.Y.

[73] Assignee: Fairchild Camera and Instrument Corporation, Mountain View, Calif.

[21] Appl. No.: 868,822

[22] Filed: Jan. 12, 1978

[51] Int. Cl.³ ............... G01R 31/02; G01R 15/12
[52] U.S. Cl. ............... 324/158 F; 324/73 PC; 339/75 M; 339/117 P
[58] Field of Search ........... 324/158 F, 158 P, 73 PC, 324/73 R, 72.5; 92/6 D, 89, 169, 170, 240, 245, 6 R; 339/45 M, 66 M, 75 M, 117 P

[56] References Cited

U.S. PATENT DOCUMENTS

| | | | |
|---|---|---|---|
| 2,950,739 | 8/1960 | Lofink | 92/6 D |
| 3,137,361 | 6/1964 | Randol | 92/169 |
| 3,564,408 | 2/1971 | Schulz et al. | 324/158 F |
| 3,603,297 | 9/1971 | Sherwin et al. | 92/89 |
| 3,818,805 | 6/1974 | Johansson | 91/402 |
| 3,970,934 | 7/1976 | Aksu | 324/158 P |
| 4,017,793 | 4/1977 | Haines | 324/158 F |

Primary Examiner—Ernest F. Karlsen

[57] ABSTRACT

A fixturing system including a product access unit, receiver and support bracket. The product access unit has a top plate upon which the product under test is placed, which top plate is movable so as to carry the product under test into contact with a field of test probes. The product access unit also has a contact panel disposed outboard of the field of test probes, said contact panel containing electrical contact posts wired to the test probes. The contact panel is provided with mating guides and the receiver includes mechanical means for engaging and locking with these guides. The support bracket includes sockets which co-operate with guide pins on the product access unit for aligning it for assembly with the receiver. The product access unit is vacuum-operated and a perimeter gasket on the top plate forms a seal with an inwardly sloping portion of the housing containing the vacuum plate.

20 Claims, 13 Drawing Figures

FIXTURING SYSTEM

BACKGROUND OF THE INVENTION

This invention relates to the field of automatic testing of printed circuit boards, and more particularly, it relates to a fixturing system which can be used with automatic test equipment.

In order to test an electrical product such as a printed circuit board, means must be provided for connecting the circuit board to the test system. Where in-circuit tests are to be conducted, a plurality of connections must be made to some or all of the nodal points of the circuits being tested. This is commonly done by means of probes which are individually connected to the test system and which can be brought into contact with the various nodal points in the circuit paths on the backs of the circuit boards being tested. The device containing the probes is often referred to as a fixture or a product access unit.

One popular type of a fixture used in in-circuit testing today utilizes a vacuum both to draw the circuit board being tested down tightly on the fixture and to cause the probes to advance into contact therewith. The probes are typically spring loaded on a platen which is drawn upwardly as the interior of the fixture is evacuated until the probes make contact with the circuit board. These probes are normally connected by wires to a plugboard which, in turn, is connected to the test system. Generally, the vacuum chamber portion of the fixture is held vertically above the plugboard by metal braces. It can be appreciated that neither the underside of the probes contained in the upper vacuum chamber portion of fixtures such as this, nor the connections to the plugboard are very accessible due to the physical arrangements just described and the presence of a plurality of wires running down from the probes to the plugboard. This is unfortunate because there are times when it is advantageous to have access to individual electrical connections contained in these areas. One may wish, for example, to check a wiring connection or to attach an electrical measuring instrument of some type to a probe in order to monitor that probe as the test system is operated. Another disadvantage associated with the kinds of fixtures just described is that they are quite expensive to manufacture. The top plates of these fixtures, for example, must be precision drilled in order to provide holes to permit the probes to pass therethrough, and at the same time, to serve as guides in maintaining the alignment of the probes. Also, the configuration of this kind of a fixture does not lend itself to the use of cost-saving wire-wrapping tools. Yet another disadvantage associated with this type of fixture concerns storage. Because the vacuum chamber and plugboard are held in a spaced-apart relationship by metal struts, they necessarily occupy a relatively large volume of space. This can be quite significant because most users of automatic test equipment test a great number of circuit boards of various sizes and complexity. Since, in general, a separate fixture is required for each type of board to be tested, a substantial number of fixtures must be stored. Yet another disadvantage of the type of fixture here under discussion is that it is relatively cumbersome to handle and to attach to the receiver of an automatic test system. The standard plugboard arrangements, with exposed wires, although adequate for this application, are far from the optimum in terms of ease of handling and avoidance of unnecessary damage to the fixture and receiver. Also, the operator time consumed in changing fixtures is longer than it need be. A final disadvantage common to the kind of fixture here under discussion concerns the seal between the movable platen carrying the test probes and the housing of the vacuum chamber. This seal is normally made by gluing a strip of gasket material around the border of the platen so that it overhangs the edge of the platen and touches the inside of the housing. Since the housing is usually a metal casting, its interior surface is relatively rough and a significant amount of leakage normally occurs. Also, the scraping of the gasket against this housing as the platen moves up and down tends to cause wearing of the gasket over a period of time and even greater leakage. Depending on usage, the efficiency of the seal will diminish to the point where repair is required. All of the above disadvantages are eliminated by the present invention by the provision of a novel product access unit as well as a novel receiver and means for aligning and assembling the product access unit with the receiver. These elements are brought together in a systemic approach permitting maximum utilization of cost-saving techniques in their fabrication. Means are also provided for using these novel structures with existing test systems having conventional plugboard receivers.

SUMMARY OF THE INVENTION

It is, therefore, an object of this invention to provide a fixturing system in which easy access to the interconnections between the test probes and the associated test circuitry is afforded.

It is a further object of this invention to provide a fixturing system including a product access unit, a receiver and associated structures which will be relatively simple to accurately align and to assemble and disassemble, without damage, in a minimum of time.

It is a further object of this invention to provide a product access unit in such a configuration as to require a minimum of storage space when not in use.

It is a further object of this invention to provide means for using the novel product access unit and receiver in existing test systems having conventional plugboard receivers.

It is a further object of this invention to provide an improved seal between the moveable an nonmoveable parts of the product access unit.

The present invention is a fixturing system in which a product access unit is provided having a field of test probes mounted in a vacuum well arrangement and a field of contact posts disposed outboard thereof for connection in a test system through a complimentary receiver.

DESCRIPTION OF THE PREFERRED EMBODIMENT

Figure 1:
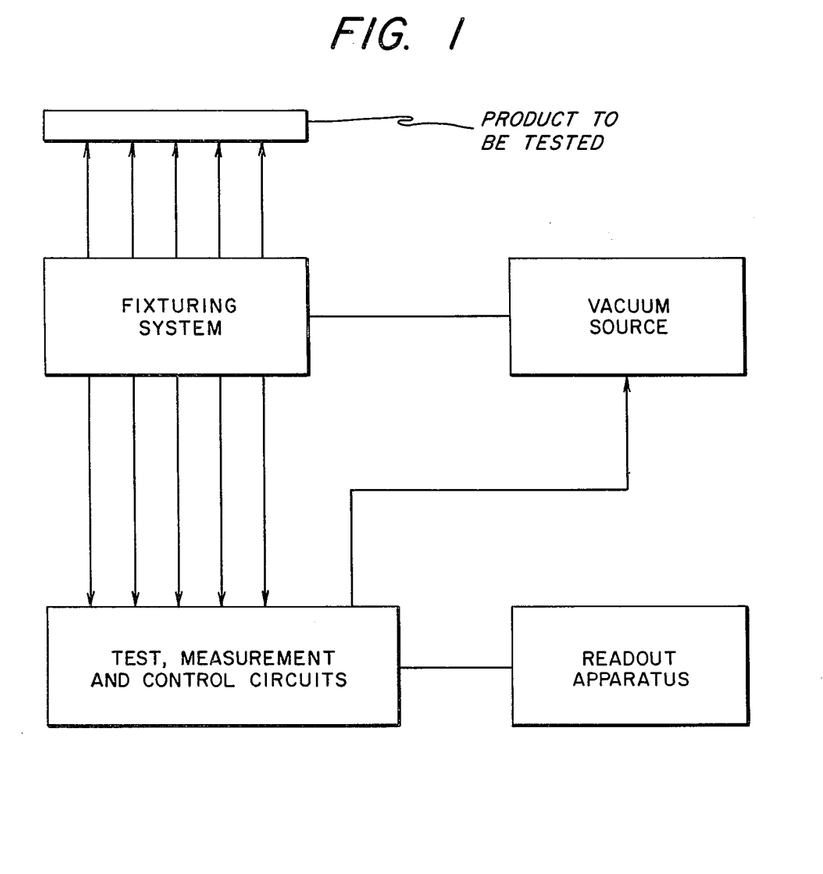
FIG. 1 is a schematic diagram showing the general relationship of a fixturing system to other components in an automatic test system.

As represented in FIG. 1, an automatic test system for production testing of a product such as a printed circuit board uses a fixturing system of some type to make a plurality of electrical contacts with the product under test. These contacts are used both for the transmission of test stimuli and response data between the product under test and the test and measurement circuits of the test system. With a vacuum-operated fixturing system suitable control circuits are provided to selectively connect and disconnect the vacuum source to and from the fixturing system at certain times in the test cycle. Test results are presented on various types of readout apparatus.

Figure 2:
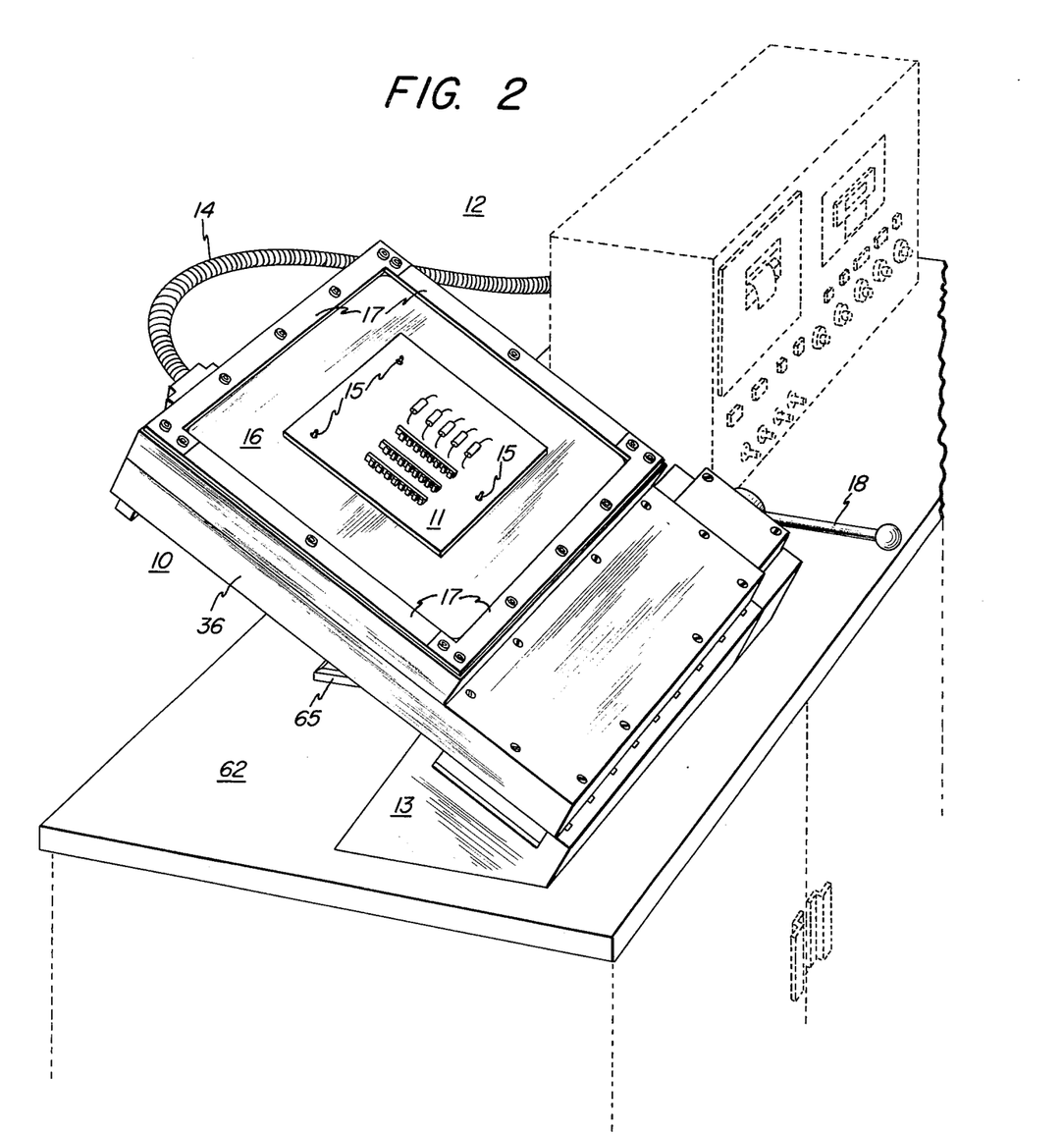
FIG. 2 is a perspective view of the invention shown in a typical arrangement in an automatic test system with a circuit board in place for test.

Referring now to FIG. 2 there is shown a fixture or product access unit 10 in a typical arrangement for testing a printed circuit board 11 in an automatic test system 12. Product access unit 10 is connected to automatic test system 12 by means of a receiver 13. Product access unit 10 is also connected by means of tube 14 to a vacuum source controlled by automatic test system 12. Printed circuit board 11 is typically provided with holes which co-operate with studs 15 in establishing and maintaining a proper alignment of the printed circuit board on the product access unit, as will be more fully appreciated hereinafter. Also, as described below, studs 15 are rigidly mounted within the product access unit and pass through a movable top plate 16 which, in turn, is retained by trim pieces 17. A handle 18 is provided on receiver 13 for assembling and disassembling product access unit 10 to and from the receiver 13. The method of assembly will be fully described below.

Figure 3:
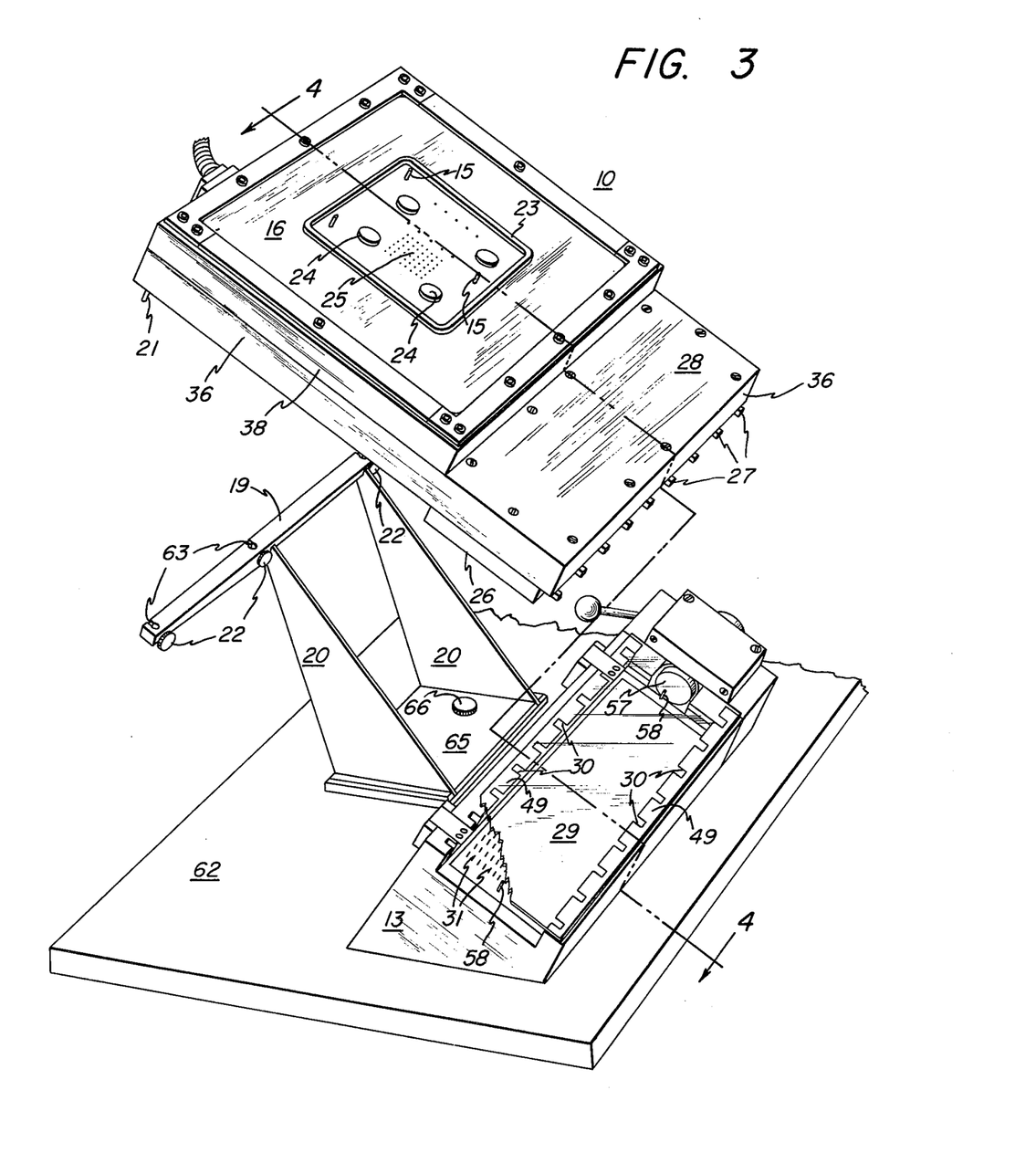
FIG. 3 is a perspective view of the invention wherein the product access unit is shown disassembled from the receiver and the circuit board is removed.

Referring now to FIG. 3, the product access unit 10 is shown separated from receiver 13. A guide bar 19 is rigidly connected to support members 20 which, in turn, are rigidly connected to mounting plate 65. Mounting plate 65 is rigidly connected to a stable work surface 62 by means of one or more thumb screws 66. The receiver 13 is likewise rigidly connected to work surface 62. Guide pins 21 (only one is visible in FIG. 3) are rigidly affixed to product access unit 10 and sized and located to freely fit into guide sockets 63 on guide bar 19. Adjusting screws 22 are provided on guide bar 19 protruding into guide sockets 63 for precisely setting the distance that guide pins 21 will be held from receiver 13 in the assembled state. This feature enables the operator to establish a proper alignment between product access unit 10 and receiver 13 as the two are being joined. Guide pins 21 are first hung in guide sockets 63 against the protruding ends of adjusting screws 22. Assuming a proper adjustment had been made with screws 22, a product access unit of standardized dimensions can be quickly lowered into mating relationship with receiver 13. Guide posts 58 are rigidly mounted, as shown, within receiver 13. Although not visible in FIG. 3, corresponding guide post sockets are formed in the underside of contact panel 26 to mate with guide posts 58.

In FIG. 3 the product being tested, typically a printed circuit board, is not shown. Studs 15 protrude through top plate 16. A sealing gasket 23, made of neoprene or some other suitable gasket material is provided as the surface upon which the product being tested is placed. During tests, the circuit board is drawn down tightly against the gasket by a vacuum and pads 24 are placed at various places within gasket 23 to prevent warping of the circuit board. A plurality of holes 25 are provided in order to permit contact probes to pass through top plate 16 during test in a manner which will be more fully appreciated hereinafter. Top plate 16 may be made of paper, cloth, glass laminate, phenolics or some other similar material.

Contact panel 26 is connected to the underside of product access unit 10 and is provided with a dual row of mating guides 27, although only one row is visible in FIG. 3. Contact panel 26 is oblong in shape and it is sized to mate within a trough-shaped recess in receiver 13 more fully described below.

Receiver 13 is provided with a protective transparent cover 29, shown closed in FIG. 3. A series of mating slots 30 are provided in a configuration matching the dual rows of mating guides 27. As can be appreciated, the mating guides 27 are inserted into mating slots 30 as product access unit 10 is assembled to receiver 13. It will be noted that receiver 13 is provided with a field of electrical probes 31. Although not visible in FIG. 3, a field of contact posts is provided in the underside of contact panel 26 in a configuration matching the configuration of probes 31.

Figure 4:
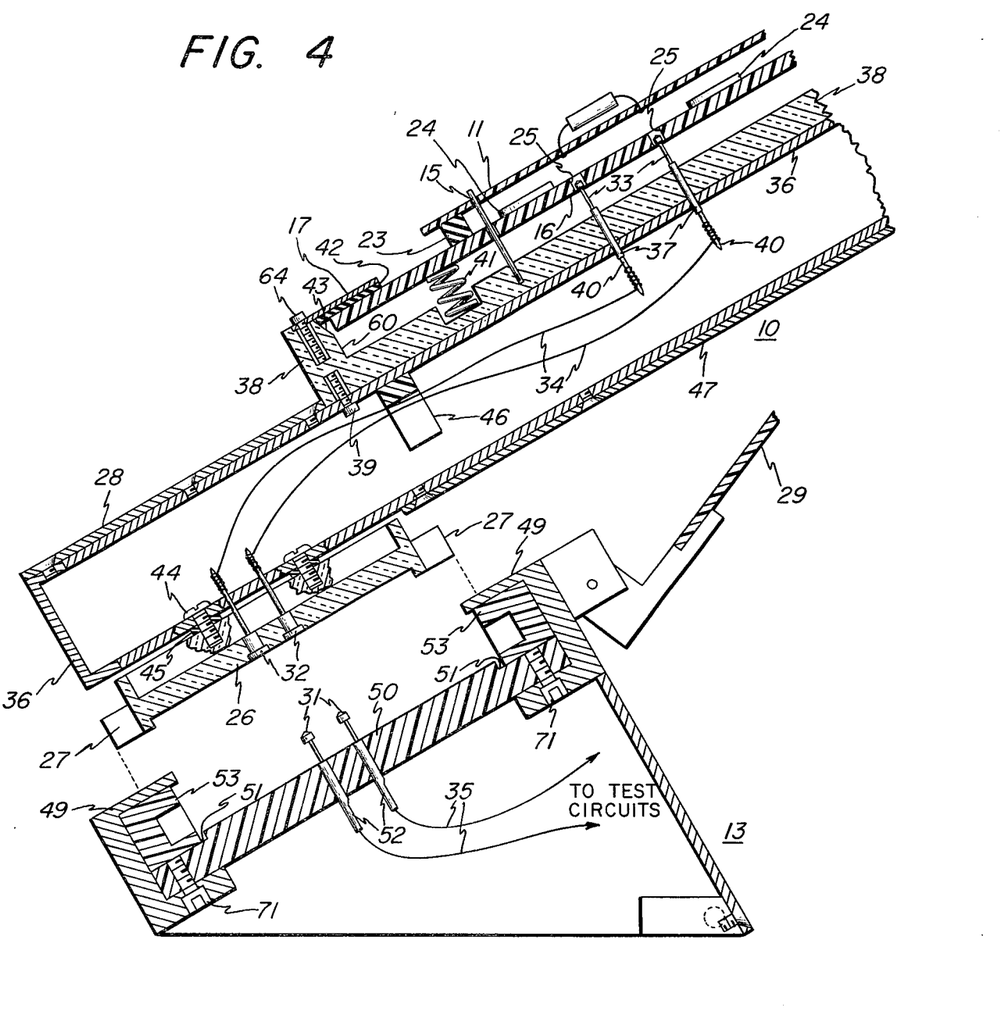
FIG. 4 is a cross-sectional view, with parts broken away, of a portion of the invention taken on lines 4—4 of FIG. 3, but with the receiver cover open.

FIG. 4 is a cross-sectional view of the product access unit 10 and receiver 13 in a disassembled, but generally aligned, state. For clarity, only two each of receiver probes 31, contact posts 32 and test probes 33 are shown. However, it will be understood that many more are ordinarily provided. Typically, for example, receiver 13 may be provided with a field of about 2,800 probes 31 arranged in a grid pattern on 150 mil centers. Product access unit 10 may be provided with as many probes 33 or with some fewer number, depending upon the number of points to be contacted on the particular circuit board to be tested. It will be seen that each test probe 33 is wired to a contact post 32. Contact posts 32 are arranged in a grid pattern matching that of contact probes 31. Thus, once the product access unit 10 is mated to receiver 13 an electrical connection is established between each test probe 33 and the circuits of the automatic test system via wires 34, contact posts 32, receiver probes 31 and wires 35. During an actual test, appropriate voltages and currents may be applied to selected points on the product being tested through certain of the test probes 33 while other of the test probes 33 will monitor the outputs from these devices and feed the results into the test and measurement circuits where they can be analyzed. Probes 33 and 31, as well as contact posts 32 are of the conventional type available in the market place.

For basic structural support of the product access unit, a frame member 36 is provided as shown in FIGS. 3 and 4. This would normally be a channel strip formed in metal or plastic in any conventional manner and having suitable strength for supporting the other parts of the product access unit. A vacuum well 38 formed of molded fiberglass or similar material is attached to frame 36 in any suitable manner such as by screws 39. The vacuum well 38 may be of such size and shape as is required to accommodate a particular type of circuit board to be tested. As depicted here, vacuum well 38 has the configuration of a shallow tray having relatively short sidewalls 60 running around its four sides. Test probes 33 are desirably of the spring-loaded, pluggable, removable type. These, in turn, are mounted in standard probe receptacles 37, also readily available in the market place. Probe receptacles 37 are firmly mounted at desired points in the bottom of vacuum well 38. As illustrated in FIG. 4, probe receptacles 37 are provided with wire wrap posts 40.

Movable top plate 16 rests on a number of springs 41, although only one is depicted for the sake of simplicity. Springs 41 are mounted in suitable recesses formed in the bottom of vacuum well 38. Top plate 16 is contained by trim piece 17 which, in turn, is attached in some suitable way, as by screws 64, to sidewall 60 of vacuum well 38. A perimeter gasket 42 which may be of any suitable gasket material is glued or otherwise attached to top plate 16. As shown, gasket 42 extends far enough beyond the edge of top plate 16 to make contact with sidewall 60 of vacuum well 38. It should also be noted that the sidewalls 60 of vacuum well 38 are formed with a sloped portion 43. As will be seen hereinafter, this feature promotes the making of a good vacuum seal between top plate 16 and the sidewalls of vacuum well 38. Holes 25 in top plate 16 are larger in diameter than the tips of test probes 33 in order to insure the free movement of the test probes through top plate 16 when the product access unit is activated. Alternatively, one could provide a large single opening in top plate 16 to accommodate the passage of all probes 33. This would be particularly true in the testing of smaller circuit boards, for example, since warping is then less pronounced and support pads 24 can be eliminated. The use of this alternative would eliminate the need for drilling holes 25 and would also allow for more clearance between circuit board 11 and plate 16 for protruding structures found on some circuit boards.

Studs 15 are rigidly mounted in the bottom of vacuum well 38 at locations where no probes are required, such locations generally corresponding to clear areas on the outer protions of the product being tested where no circuitry is found. These studs can be in such number, say three, as will serve to maintain the alignment of plate 16 and product 11 as they are drawn down into the well 38, as described below. The holes in plate 16 and product 11 through which studs 15 pass should be just large enough to permit a freely slidable fit with studs 15.

Contact panel 26, which is made of molded fiberglass or a similar substance, is attached to frame 36 by means of screws 44. It is desirable to provide "O-rings" 45 as washers between contact panel 26 and frame 36. These rings may be made from neoprene or some other suitable compressible material. Mounting contact panel 26 to frame 36 in this fashion permits a desirable amount of flexibility between the contact panel and the frame, as will be seen hereinafter. Contact posts 32 are of a standard female type and are matched with the tips of receiver probes 31 to insure good seating and contact between them. Posts 32 are essentially flush-mounted rigidly in contact panel 26. Contact posts 32 are provided with wire wrap posts and are connected with the wire wrap posts of probe receptacles 37 by means of wires 34. Wires 34 are desirably gathered and organized in a wiring support 46. An access cover 47 may be attached with screws to frame 36. Similarly, access cover 28 is attached by screws to frame 36. It will be appreciated that relatively easy access is thus afforded to the wiring side of contact posts 32 and test probe receptacles 37.

As shown in FIG. 4, rails 49 are mounted on receiver 13 so as to face each other on either side of the receiver. These rails may be formed of any suitable material such as steel, aluminum, reinforced plastic or the like. A base plate 50 is attached to rails 49 in some suitable fashion as by screws 71. Base plate 50 may be delrin, fiberglass or some other suitable substance having suitable mechanical and electrical properties and being reasonably susceptible to machining or molding. It should be noted that base plate 50 is provided with lower channel portions 51. Also, receiver probes 31 should be of the spring-loaded type and are preferably of the pluggable type. These, in turn, may be plugged into probe receptacles 52. Tracks 53 are slidably mounted on the channel portions 51 of base plate 50.

Figure 5:
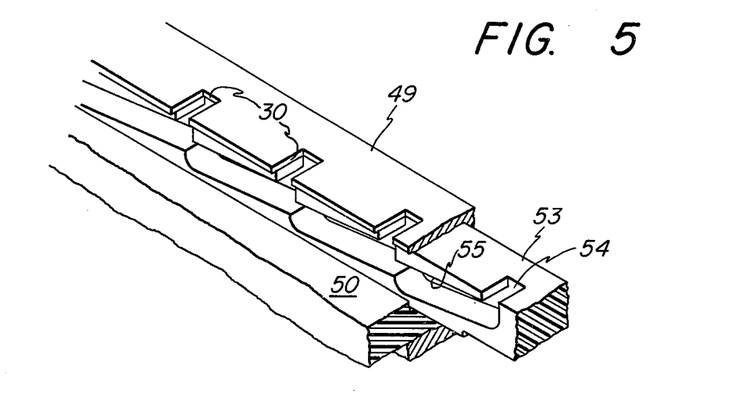
FIG. 5 is a fragmentary perspective view of certain parts depicted in FIG. 4.

A more detailed view of portions of rail 49, track 53 and base plate 50 is shown in FIG. 5. It will be noted that track 53 is provided with a number of mating slots 54 and camming surfaces 55. Slots 54 are sized and spaced apart in a pattern corresponding with mating notches 30 on rail 49 and the mating guides 27 on contact panel 26. Track 53 is desirably formed and machined in nylon, delrin or some other material of suitable strength and having a low coefficient of sliding friction with relation to the materials chosen for rail 49, mating guides 27 and base plate 50.

Figure 6:
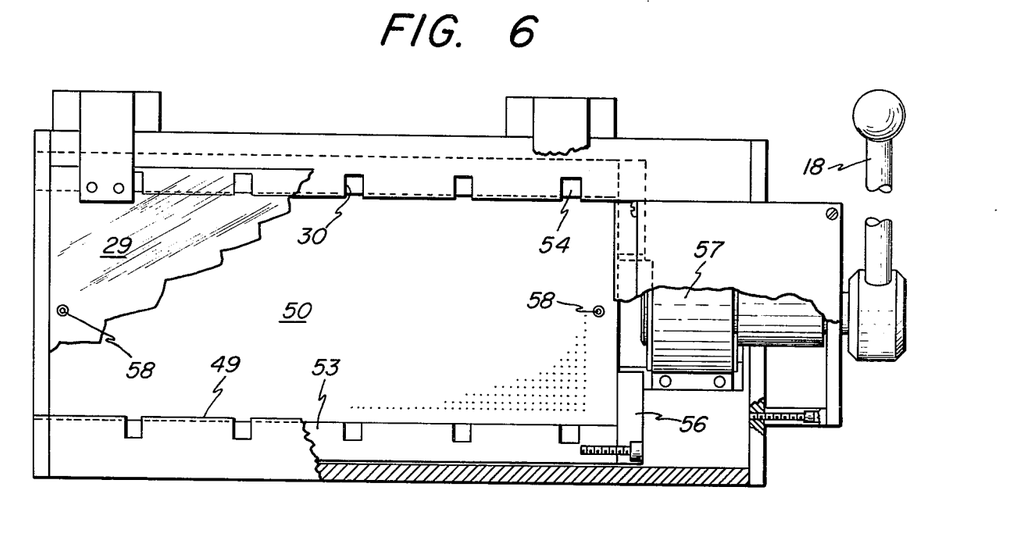
FIGS. 6 and 7 are top plan views of the receiver showing the opened and closed positions of the parts depicted in FIG. 5 and their relationship with the operating handle.
Figure 7:
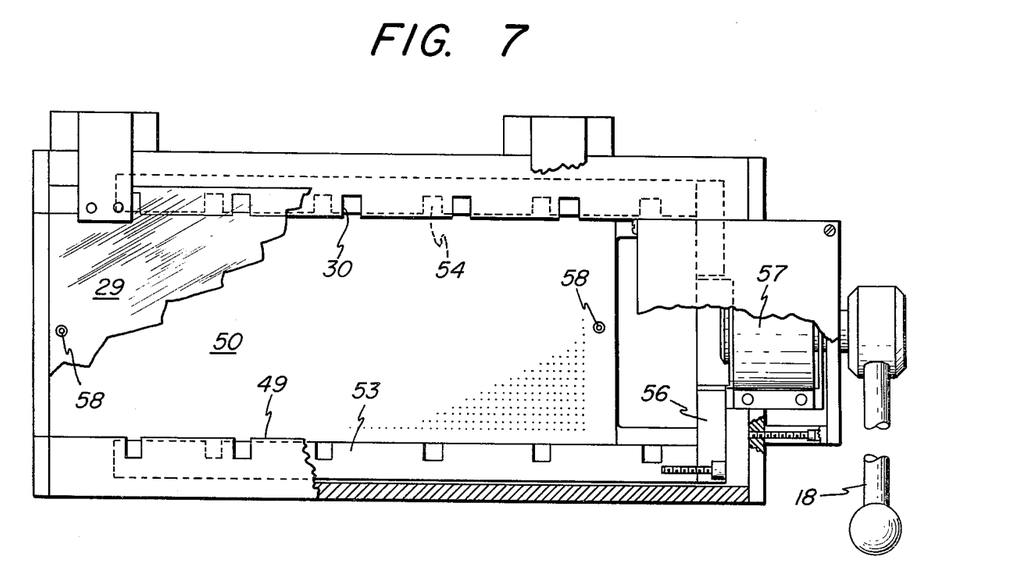

Referring to FIG. 6, it will be seen that track 53 is firmly attached to a cross-member 56 by means of screws. Cross-member 56 is the moving member of rotary actuator 57 to which operating handle 18 is attached. Rotary actuator 57 may be of any conventional type appropriate to convert the rotary action of operator handle 18 to linear movement in cross-member 56. In the preferred embodiment a rotation of about 180° has been converted to about 1.5 inches of linear motion. In FIGS. 6 and 7 it will also be noted that vertical studs 58 are firmly mounted in base plate 50. Corresponding alignment holes are formed in contact panel 26 as an aid to alignment as product access unit 10 is assembled with receiver 13.

As shown in FIGS. 6 and 7, tracks 53 are slid within rail 49 as handle 18 is rotated. In one position, as shown in FIG. 6, the mating slots of tracks 43 are aligned with the mating notches 30 of rails 49. In FIG. 7, rails 53 have been displaced to the right, having been drawn in that direction by cross-member 56, thereby misaligning the slots and notches. The result of this action when the product access unit is assembled with receiver 13 may be seen in FIGS. 8 and 9.

Figure 8:
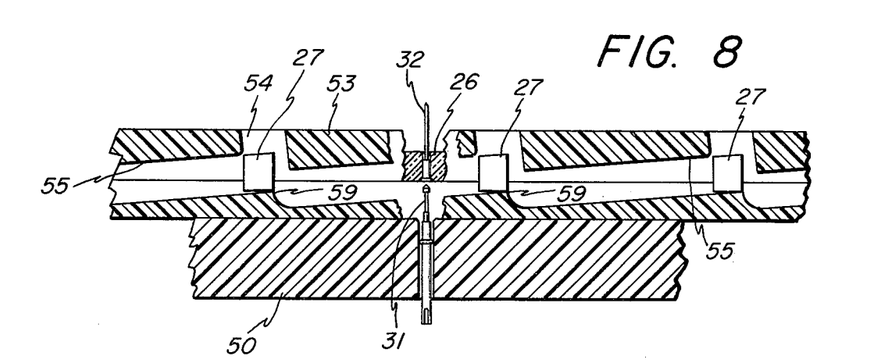
FIGS. 8 and 9 are fragmentary cross-sectional views of the parts depicted in FIG. 5 shown in mating relationship with the corresponding parts of the product access unit in the opened and closed positions.

In FIG. 8, mating guides 27 are shown within mating slots 54. This is the position in which these structures would be upon insertion of the mating guides through the mating notches 30 on rail 49 while slots 54 are aligned with notches 30. Thus, there is positional correspondence between FIGS. 6 and 8. It will be noted that contact post 32 does not meet receiver probe 31 when the parts are in this relationship. A shoulder 59 is provided within track 53 so that the depth of mating slot 54 will not be sufficient to permit posts 32 to meet probes 31. This arrangement prevents damage to the probes which might otherwise occur if these parts were allowed to clash during the loading of contact panel 26 into receiver 13.

Figure 9:
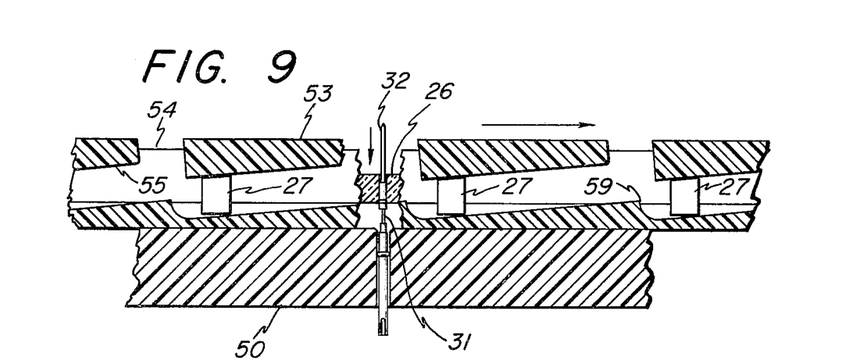

When handle 18 is operated causing track 53 to be drawn to the right, according to FIG. 9, mating guides 27 are urged downwardly, thus pulling the contact panel 26 and the product access unit 10 itself into receiver 13. Since studs 58 are inserted into holes in contact panel 26, there will be no sideward motion of contact panel 26. As the contact panel moves downwardly, contact posts 32 meet with their corresponding spring-loaded probes 31 and push them downwardly compressing their springs. In the preferred embodiment the downward movement of contact panel 26 is about ⅛ of an inch and the contact pressure developed between each contact post 32 and its corresponding probe 31 is about 4 ounces.

It will occur to those skilled in the art that simple modifications can be made in the structures just described in order to provide successive connection of one or more probe-post pairs. To accomplish this, one need only use spring probes of various lengths and predetermined spring tensions to bring about the desired pattern of connections with suitable contact pressures.

The longest probes will make contact first while the shortest will make contact last. One might also provide flats or plateaus in camming surfaces 55 at depths where the points of contact occur, thus enabling the operator to "feel" the various contact positions. This modification would be particularly useful, for example, in those situations where it is desirable to connect only certain nodal points in the circuit under test during certain parts of the test program and other nodal points during other parts of the test program.

Figure 10:
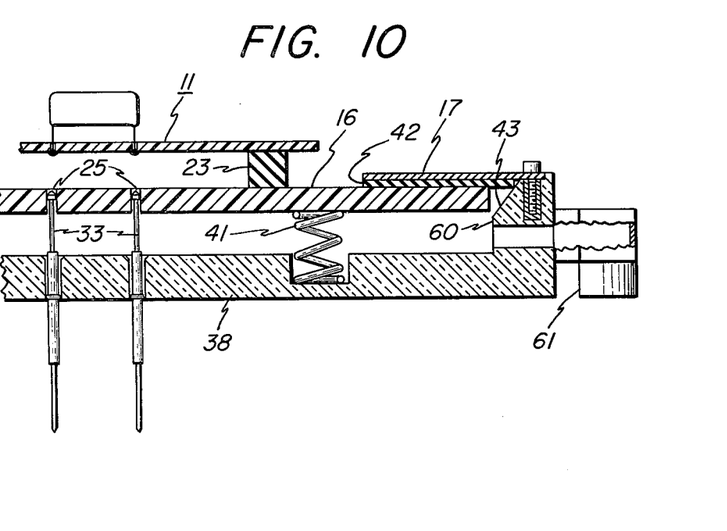
FIGS. 10 and 11 are fragmentary cross-sectional views of the product access unit prior to and during test.
Figure 11:
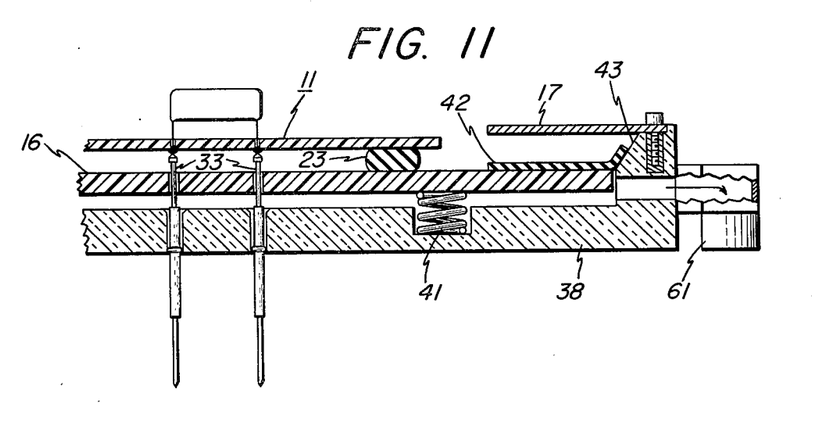

Referring now to FIGS. 10 and 11, there is illustrated the action of the product access unit when it is activated by connection to the vacuum source. In FIG. 10, it is seen that the springs 41 hold top plate 16 against trim pieces 17. The product being tested, circuit board 11, rests on gaskets 23. Perimeter gasket 42 rests against the underside of trim pieces 17 and makes light contact with inclined surface 43 of sidewall 60. Probes 33 are recessed within holes 25 in top plate 16.

When vacuum well 38 is evacuated through vacuum connection member 61, top plate 16 is drawn down into the vacuum well, as shown in FIG. 11. Perimeter gasket 42 is deformed and caused to drape itself along inclined surfaces 43, making a good vacuum seal. Gasket 23 is also deformed due to the downward pressure on product 11. The tips of probes 33 are in contact with selected points on the underside of product 11, generally nodal points on the circuit path side of printed circuit boards. Probes 33 are telescoped somewhat into their housings against the springs contained therein, thereby providing firm contact with product 11.

The moving seal provided by perimeter gasket 42 is particularly effective. As shown in FIG. 10, the initial seal is very tight because spring 41 press gasket 42 against trim pieces 17. With such a tight seal around the edge of movable plate 16 its reaction upon evacuation of vacuum well 38 is highly responsive. Because surface 43 is inclined, the seal between perimeter gasket 42 and wall 60 actually improves as the degree of evacuation increases and plate 16 travels downward causing more and more surface area contact between gasket 42 and surface 43. This, of course, is desirable because the upward forces created by springs 41 and the spring probes 33 against the plate 16 and circuit board 11 respectively become substantial. Some further advantages of this seal arrangement are seen in the ease and economy of manufacture and the ease of removing top plate 16 by removal of trim pieces 17. This is especially helpful when one wishes to check or replace or add a probe 33 in the field, probes 33 being pluggable as mentioned earlier. A final advantage of this seal arrangement is its inherent low-wear factor and consequent long life expectancy. There is relatively slight rubbing between gasket 42 and surface 43. And even if some wear of the gasket 42 occurs the seal nevertheless remains effective for a substantial period of time since only the thickness of the gasket would be affected initially, causing no appreciable change in its effectiveness as a seal.

Those skilled in the art will appreciate that the location and placement of probes 33 within vacuum well 38 are chosen in accordance with the location of the nodal points on the rear of the circuit board or product being tested. A particular configuration would generally be chosen to test a particular type of circuit board. Likewise, the number of contact posts 32 actually utilized in contact panel 26 would correspond to the number of probes 33 contained in vacuum well 38. The array of receiver probes 31 can be standardized in order to accommodate a variety of product access units, utilizing as many or as few of probes 31 as may be desired. Those unused can simply be allowed to enter the empty recesses in contact panel 26 where contact posts 32 are not mounted.

It can also be noted that the pattern of mating notches 30, slots 54 and camming surfaces 55 and shoulders 59 in rail 49 and track 53 respectively are repetitive and modular. Because of this, a product access unit having a contact panel shorter than the length of receiver 13 can nevertheless be used. Likewise, since receiver 13 is open at one end, it will accommodate a product access unit having a contact panel longer than the length of receiver 13. This feature, of course, lends a measure of flexibility to the invention. It is useful on certain occasions when relatively small product access units would be used to test small circuit boards on an automatic test system having a full length receiver. Similarly, certain test systems may be equipped with shorter receivers and it may be desirable at times to be able to assemble full width product access units to them.

An advantage of the invention described herein concerns the accessibility of the electrical connections themselves. This is particularly true with reference to contact posts 32. At times, an operator of an automatic test system may wish to monitor the voltage and current patterns of a particular test probe. To do this, he may attach a suitable device to the wired end of post 32 after removing access cover 28. It should also be noted that the wired ends of probes 33 are easily available after removing access cover 47.

Yet another advantage of the above invention concerns the accuracy of alignment and the uniformity of electrical contacts made between posts 32 and receiver probes 31. As noted earlier, contact panel 26 is flexibly mounted to frame 36 and the contact panel itself is molded in some reasonably flexible material such as reinforced plastic. Typically, there will be slight variations in the trueness of the plane of contact panel 26 in which posts 32 are mounted. This variation will be virtually eliminated because the camming surfaces 55 of track 53 can be machined within close tolerances so that when the product access unit is assembled to receiver 13, mating guides 27 will be forced into truer alignment with one another as track 53 is firmly pressed against and conformed to the plane of the top inner surface of rail 49. The flexible mounting of contact panel 26 by means of O-rings 45 enhances this tendency and it also permits any reasonably small lack of general parallelism between the planes of the contact panel 26 and receiver base plate 50 to be corrected as the product access unit is assembled and locked into the receiver.

Figure 12:
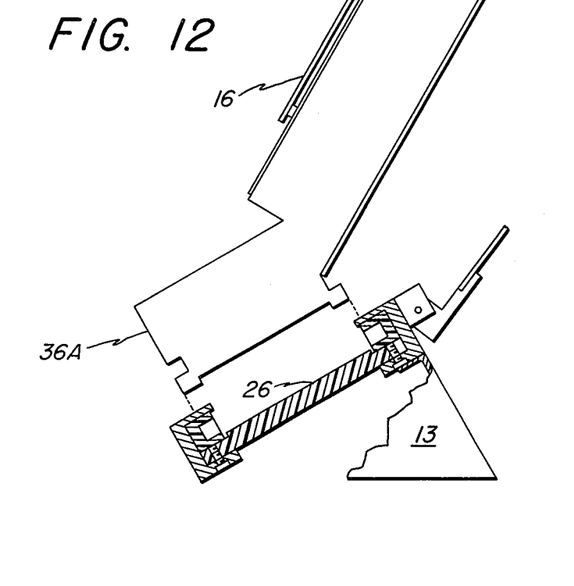
FIG. 12 is a cross-sectional view, similar to FIG. 5, of the receiver and a modified form of the product access unit.

FIG. 12 illustrates a modified form of the invention useful in certain applications where, for example, the circuit board being tested contains liquid mercury devices which are properly operable only when in a relatively upright position of, say, 60° to the horizontal. The standard configuration of receiver 13 normally inclined at 30° to the horizontal need not change. However, frame members 36A can be constructed in a conventional way to provide an additional 30° between the planes of the contact panel 26 and movable top plate 16. The standard guide bar 19, support members 20 and plate 65, which collectively constitute a support bracket for the product access unit, as shown in FIG. 3, would be replaced with similar parts designed to support the modified product access unit at the higher angle.

Figure 13:
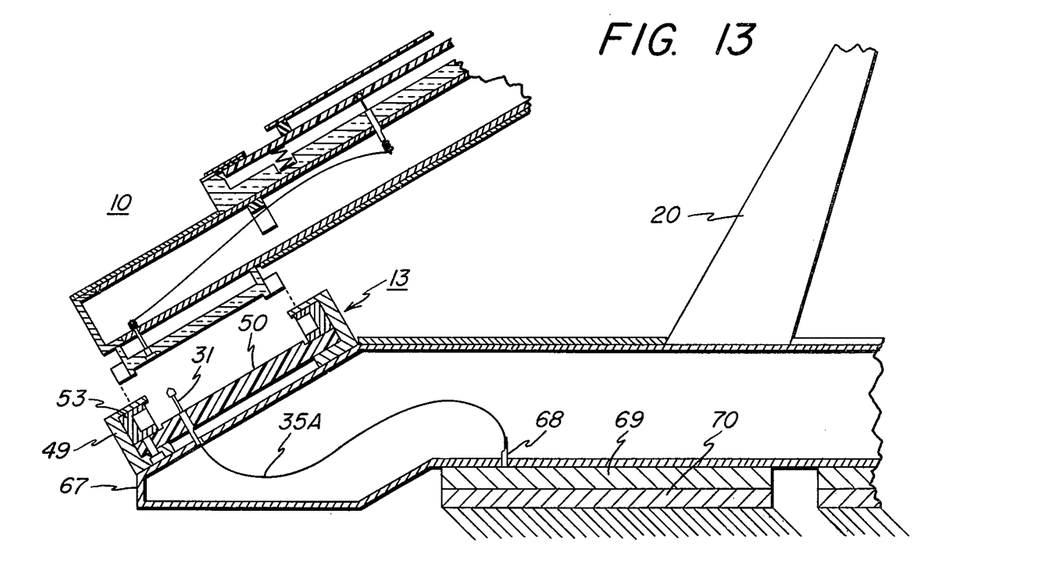
FIG. 13 is a cross-sectional view of a product access unit and a receiver adapted to be used in existing test systems having conventional plugboard receivers.

FIG. 13 illustrates in cross section a structure which permits the use of the receiver 13 and product access unit 10 to be used in existing test systems having conventional plugboard types of receivers. Rails 49, tracks 53 and base plate 50 are mounted on a hollow housing 67 equipped with one or more plugboard elements 69 appropriate to mate with the plugboard receiver 70 on the system. Probes 31 are connected by wires 35A and plug elements 68 to plugboard elements 69. Support members 20 and the associated support bracket members, as depicted in FIG. 3 are appropriately sized and mounted on top of housing 67.

It will be appreciated that various modifications can be made to the structures described above without departing from the spirit of this invention. It is intended to encompass all such modifications within the following appended claims.

What is claimed is:

1. A fixturing system for making electrical connections between selected points on a product and an electrical apparatus comprised of:

a product access unit adapted to mate with a receiver and having a field of probes for contacting the selected points, and also having a field of posts electrically connected to the probes, the field of posts being disposed laterally outboard from the field of probes such that all the electrical connections are externally accessible during use and operation of the fixturing system;

a receiver having a field of probes connected to the apparatus and adapted to make electrical contact with the posts when the receiver is mated with the product access unit; and means for mating the product access unit with the receiver, said mating means including at least one mating guide connected to the product access unit, a track slideably mounted on the receiver and having at least one mating slot therein for receiving the guide and a camming surface communicating with each slot for engaging the guide and drawing it into the receiver as the track is slid, and means for sliding the track on the receiver.

2. The system of claim 1 wherein the field of receiver probes contains a plurality of groups of probes, each group being of essentially one length, whereby the groups of probes meet the contact posts in succession from the longest to the shortest as the mating means are operated.

3. The system of claim 1 wherein the depth of the mating slot is not sufficient to permit the posts to meet the receiver probes when the guide is therein and wherein the camming surface is adapted to gradually draw the guide into the receiver to and beyond the point where the posts and probes meet.

4. The system of claim 3 wherein the receiver probes are resiliently mounted in the receiver so that their contact with the posts is made increasingly firm as the product access unit is drawn into the receiver beyond the point of initial contact between the posts and probes.

5. The system of claim 4 wherein the product access unit includes a contact panel having the field of posts mounted therein and having the at least one mating guide protruding therefrom, and wherein the contact panel is flexibly mounted on the product access unit.

6. The system of claim 5 wherein the receiver is trough-shaped having at least one open end whereby to accommodate product access units having contact panels longer than the receiver.

7. The system of claim 6 wherein the product access unit probes and the receiver probes are substantially upfacing, and the contact posts are substantially down facing, whereby the wired ends of the contact posts are accessible from the top side of the product access unit.

8. The system of claim 5 wherein the contact panel is formed of a flexible material with a plurality of guides protruding therefrom in a repetitive pattern and wherein the track is formed with mating slots and camming surfaces in a corresponding pattern, whereby variations in the plane of the contact panel will be substantially eliminated in the mating action of the system.

9. The system of claim 4 further comprising at least one guide pin mounted on the product access unit at a preselected distance from the contact panel and a bracket member mounted on the apparatus having one socket therein for each guide pin and adapted to engage the guide pin and hold it at the preselected distance from the receiver, whereby to facilitate the assembly of the product access unit with the receiver.

10. The system of claim 1 wherein the product access unit is further comprised of:

a vacuum well having the field of probes mounted therein, said well being connectable a vacuum source; and a plate resiliently mounted on the well for holding the product, said plate being adapted to be drawn into the well by a vacuum and havin at least one opening therein to permit the probes to pass therethrough to the product, said well having sidewalls which slope inwardly, at least in part, in the direction in which the plate is drawn and said plate including a perimeter gasket extending beyond the edge of the plate so as to contact the sidewalls near the beginning of the sloped portion of the sidewalls before evacuation of the well and adapted to be in contact with an increasingly large area of the sloped portion as the plate is drawn into the well, thereby forming an increasingly effective seal between the gasket and the sidewalls.

11. The invention of claim 1, wherein the receiver further includes one rail for each track, said rails being effective to hold the tracks onto the receiver while at the same time allowing the tracks to slide within the rails, said rails having slotted portions in a pattern which corresponds to the pattern of the mating slots within the tracks.

12. The system of claim 3, further comprising:
   at least one guide post, rigidly mounted within the receiver; and
   at least one guide post socket adapted to engage the guide post, such that as the posts and probes are drawn together the product access unit cannot be moved laterally with respect to the receiver.

13. A receiver for use in a fixturing system comprised of:
   a base plate having a field of probes mounted thereon;
   at least one rail connected to the base plate and being adapted to contain a track, said rail having slotted portions therein for receiving mating guides;
   a track contained within each rail, said track being slideably mounted on the base plate, having a slotted portion adapted to be aligned with the slots in the rail and also having a camming surface in communication with each slotted portion for engaging the mating guides; and
   actuating means connected to each track for sliding same within its rail.

14. A fixturing system for making electrical connections between selected points on a product and an electrical apparatus comprised of:
   a vacuum-operated product access unit adapted to mate with a receiver and having a field of test probes for contacting the selected points, and also having a field of contact posts electrically connected to the probes, said product access unit also having
      a vacuum well having the field of probes mounted therein, said well being connectable to a vacuum source,
      a plate resiliently mounted on the well for holding the product, said plate being adapted to be drawin into the well by a vacuum and having at least one opening therein to permit the probes to pass therethrough to the product,
      said well having sidewalls which slope inwardly, at least in part, in the direction in which the plate is drawn and said plate including a perimeter gasket extending beyond the edge of the plate so as to contact the sidewalls near the beginning of the sloped portion of the sidewalls before evacuation of the well and adapted to be in contact with an increasingly large area of the sloped portion as the plate is drawn into the well, thereby forming an increasingly effective seal between the gasket and the sidewalls;
   a receiver having a field of receiver probes connected to the apparatus and adapted to make electrical contact with the posts when the receiver is mated with the product access unit; and
   means for mating the product access unit with the receiver.

15. Apparatus for mechanically joining two objects comprised of:
   a contact panel attached to one of the objects, said contact panel adapted to mate with a receiver by having a plurality of mating guides protruding therefrom in a repetitive pattern in at least two rows;
   a receiver attached to the other object;
   a pair of tracks slideably mounted on the receiver, each having a plurality of slots and camming surfaces in a corresponding pattern for engaging a row of the guides and drawing the contact panel into the receiver when the tracks are slid; and
   means for simultaneously sliding the tracks.

16. The invention of claim 15 wherein the receiver is trough-shaped and has at least one open end whereby to accomodate contact panels extending beyond its own length.

17. The invention of claim 15 wherein the one object to which the contact panel is attached is a product access unit.

18. The invention of claim 17 wherein the product access unit includes a field of test probes for making electrical contact with a set of test points on a product to be tested and wherein a field of contact posts are mounted on the contact panel, each post being electrically connected to a corresponding test probe and being adapted to make electrical contact with a corresponding receiver probe when the contact panel is mated with the receiver and wherein the receiver includes a corresponding field of receiver probes connected to an electrical test system.

19. An improved product access unit for use in an automatic test system having a receiver with electrical connector elements therein, said product access unit being of the type having a field of electrical probes for making contact with selected points on a product to be tested wherein the improvement comprises:
   a frame;
   a contact panel attached to the frame and adapted to mate with the receiver;
   a field of contact posts mounted in the contact panel, each post being adapted to make contact with a corresponding electrical connector element of the receiver when the panel is mated therewith, and each of said posts being electrically connected to a corresponding one of the probes;
   a well attached to the frame for holding the field of probes, said well having an interior to be evacuated connectable to a vacuum source and having a bottom and sidewalls, said sidewalls each having a sloped portion formed thereon so as to make the interior of the well narrower towards its bottom;
   a plate slideably fit within the well for movement between an upper position before evacuation and a lower position after evacuation, said plate being adapted to hold the product to be tested and having at least one hole therein permitting the probes to pass therethrough to contact the product when the plate is in the lower position; and
   a gasket attached to the plate around its perimeter for movement therewith, said gasket overhanging the plate so as to make contact with the sloped portions of the sidewalls within the well at a level above the narrowest part thereof when the plate is in its upper position and so as to be in contact with a relatively larger area of the sloped portions of the sidewalls when the plate is in its lower position.

20. The invention of claim 19 wherein the contact panel includes at least one mating guide.

* * * * *